(12) United States Patent
Cho et al.

(10) Patent No.: US 8,017,952 B2
(45) Date of Patent: Sep. 13, 2011

(54) INORGANIC ELECTROLUMINESCENT DIODE AND METHOD OF FABRICATING THE SAME

(75) Inventors: Kyung Sang Cho, Gyeonggi-do (KR); Byung Lyong Choi, Gyeonggi-do (KR); Byoung Lyong Choi, Seoul (KR); Soon Jae Kwon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 89 days.

(21) Appl. No.: 11/534,867

(22) Filed: Sep. 25, 2006

(65) Prior Publication Data

US 2007/0170446 A1 Jul. 26, 2007

(30) Foreign Application Priority Data

Jan. 9, 2006 (KR) .................. 10-2006-0002189

(51) Int. Cl.
*H01L 27/15* (2006.01)
(52) U.S. Cl. .......................... 257/79; 257/103
(58) Field of Classification Search .............. 257/79, 257/103; 313/506
See application file for complete search history.

(56) References Cited

U.S. PATENT DOCUMENTS

| | | | |
|---|---|---|---|
| 5,537,000 A * | 7/1996 | Alivisatos et al. | 313/506 |
| 6,797,412 B1 | 9/2004 | Jain et al. | |
| 7,332,211 B1 * | 2/2008 | Bulovic et al. | 428/206 |
| 2004/0023010 A1 | 2/2004 | Bulovic et al. | |
| 2004/0094756 A1 | 5/2004 | Moon et al. | |
| 2005/0051766 A1 | 3/2005 | Stokes et al. | |
| 2006/0063029 A1 * | 3/2006 | Jang et al. | 428/690 |
| 2007/0103068 A1 * | 5/2007 | Bawendi et al. | 313/506 |
| 2008/0012341 A1 | 1/2008 | Shahidehpour et al. | |

FOREIGN PATENT DOCUMENTS

| | | |
|---|---|---|
| EP | 1587150 A2 | 10/2005 |
| WO | 2005071764 A1 | 8/2005 |

OTHER PUBLICATIONS

Mueller, A.H., et al.; Nano Letters 2005, vol. 5, No. 6, pp. 1039-1044, May 2005.
Coe-Sullivan et al.; "Large-Area Ordered Quantum-Dot Monolayers via Phase Separation During Spin-Casting" Advanced Functional Materials, vol. 15, pp. 1117-1124 (2005).
Search Report from the European Patent Office for the counterpart application in Europe. Dec. 14, 2009; Application No. 062564141-1235.1806791.
Scopel W L et al.: "Local structure and bonds of amorphous silicon oxynitride thin films" pp. 59-64, 2002.

(Continued)

*Primary Examiner* — Mark Prenty
(74) *Attorney, Agent, or Firm* — Cantor Colburn LLP

(57) ABSTRACT

Disclosed are an inorganic electroluminescent diode and a method of fabricating the same. Specifically, this invention provides an inorganic electroluminescent diode, which includes a semiconductor nanocrystal layer formed of inorganic material, an electron transport layer or a hole transport layer formed on the semiconductor nanocrystal layer using amorphous inorganic material, and a hole transport layer or an electron transport layer formed beneath the semiconductor nanocrystal layer using inorganic material, and also provides a method of fabricating such an inorganic electroluminescent diode. According to the method of fabricating the inorganic electroluminescent diode of this invention, an inorganic electroluminescent diode can be fabricated while maintaining the properties of luminescent semiconductor material of the semiconductor crystal layer, and also an inorganic electroluminescent diode which is stably operated and has high luminescent efficiency can be provided.

11 Claims, 2 Drawing Sheets

OTHER PUBLICATIONS

Shibata S : "Dielectric constants of Ta2O5 thin films deposited by r.f. sputtering" pp. 1-4, 1996.

Wanxue Zeng et al.: "CVD of Tantalum Oxide Dielectric Thin Films for Nanoscale Device Applications" pp. F172-F177, 2004.

Thomas R et al.: "Electrical Properties of Sol-Gel Processed Amorphous BaTiO3 Thin Films" pp. 101-107, 1999.

Yang Y et al.: "High third-order non-resonant optical non-linearities of surface modified CdS quantum dots embedded in BaTiO3 thin film" pp. 217-222, 2003.

Zhu D et al.: "Optical properties of lead lanthanum zirconate titanate amorphous thin films" pp. 210-213, 1998.

* cited by examiner

INORGANIC ELECTROLUMINESCENT DIODE AND METHOD OF FABRICATING THE SAME

This application claims priority to Korean Patent Application No. 2006-2189, filed on Jan. 9, 2006, and all the benefits accruing therefrom under U.S.C. §119(a) which is incorporated herein in its entirety by reference.

BACKGROUND OF THE INVENTION

1. Field of the Invention

The present invention relates, generally, to an inorganic electroluminescent diode and a method of fabricating the same, and more particularly, to an inorganic electroluminescent diode, comprising a semiconductor nanocrystal layer formed of inorganic material, an electron transport layer or a hole transport layer formed on the semiconductor nanocrystal layer using amorphous inorganic material, and a hole transport layer or an electron transport layer formed beneath the semiconductor nanocrystal layer using inorganic material, and to a method of fabricating such an inorganic electroluminescent diode.

2. Description of the Related Art

Various attempts have been made to solve a problem of a decrease in the lifetime of an organic electroluminescent diode due to the degradation of organic luminescent material. In this regard, U.S. Patent Application Publication No. 2004/0023010 discloses an electroluminescent diode, comprising a luminescent layer formed of inorganic quantum dots, and an electron transport layer and a hole transport layer respectively in the form of organic thin films.

In the electroluminescent diode of the above patent, organic/inorganic interfacial defects may occur because the organic thin film layers are in contact with the inorganic luminescent layer, and thus, stability is decreased upon operation of the device. Further, since it is easy for the organic thin film layer to degrade or deteriorate due to air or moisture, an additional encapsulation process should be performed to encapsulate the organic thin film layer, or the diode should be fabricated in a chamber having no oxygen or nitrogen.

Further, U.S. Pat. No. 6,797,412 discloses an electroluminescent diode composed completely of inorganic material, comprising a luminescent layer formed of a clad quantum dot thin film, a hole transport layer formed of a p-type semiconductor, and an electron transport layer formed of an n-type semiconductor.

In the electroluminescent diode of the aforementioned reference, a p-doped silicon layer and a silicon layer are formed on a substrate, after which the hole transport layer, the quantum dot thin film, and the electron transport layer are sequentially formed thereupon. Upon formation of the electroluminescent diode having the above structure, the n-type semiconductor layer is deposited at high temperatures on the quantum dot thin film. As a result, the quantum dot of the quantum dot thin film may lose its inherent quantum confinement effect due to the high temperature upon crystal growth, undesirably decreasing the luminescent efficiency and deforming the structure of the quantum dot thin film.

BRIEF SUMMARY OF THE INVENTION

Accordingly, the present invention has been made keeping in mind the above problems occurring in the related art, and in an embodiment, a method is provided of fabricating an inorganic electroluminescent diode which is composed completely of inorganic material by forming an inorganic layer on a semiconductor nanocrystal layer without degrading the semiconductor nanocrystal layer.

In another embodiment, an inorganic electroluminescent diode composed completely of inorganic material is provided, which shows stable operation and has high luminescent efficiency.

BRIEF DESCRIPTION OF THE DRAWINGS

The above and other features and advantages of the present invention will be more clearly understood from the following detailed description taken in conjunction with the accompanying drawings, in which.

DETAILED DESCRIPTION OF THE INVENTION

Figure 1:
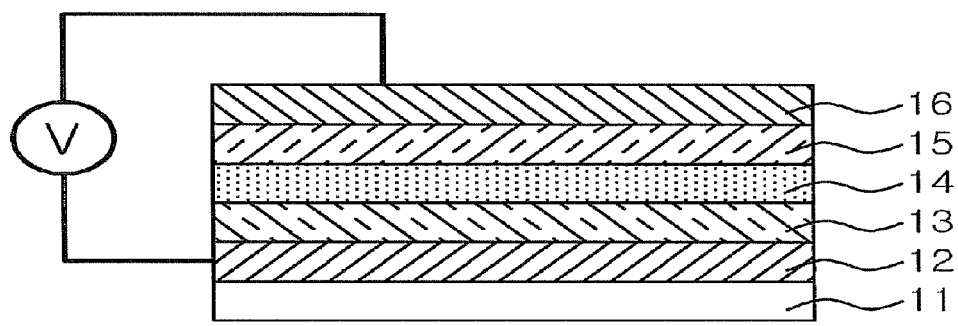
FIG. 1 is a schematic view showing an inorganic electroluminescent diode according to a first embodiment.

Below, a detailed description will be given of the present invention with reference to the accompanying drawings.

It will be understood in the following disclosure of the present invention, that as used herein, the singular forms "a", "an" and "the" are intended to include the plural forms as well, unless the context clearly indicates otherwise. It will be further understood that the terms "comprise", "comprises", and "comprising," when used in this specification, specify the presence of stated features, integers, steps, operations, elements, components, and combination of the foregoing, but do not preclude the presence and/or addition of one or more other features, integers, steps, operations, elements, components, groups, and combination of the foregoing.

It will be understood that when an element is referred to as being "on" another element, or when an element is referred to as being "disposed between" two or more other elements, it can be directly on (i.e., in at least partial contact with) the other element(s), or an intervening element or elements may be present therebetween. In contrast, when an element is referred to as being "disposed on" another element, the elements are understood to be in at least partial contact with each other, unless otherwise specified. Spatially relative terms, such as "between", "in between" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees, inverted, or at other orientations) and the spatially relative descriptors used herein interpreted accordingly. Likewise, use of the term "opposite", unless otherwise specified, means on the opposing side or surface of the element. For example, where a surface of a layer is said to be opposite another surface or element, it is located on the opposing surface of the layer coplanar with the first surface unless otherwise specified.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A method of fabricating an inorganic electroluminescent diode comprises forming an inorganic layer on a semiconductor nanocrystal layer by solution coating or vapor coating.

The method of fabricating an inorganic electroluminescent diode includes forming a first electrode, forming a first inorganic layer in electrical contact with the first electrode, forming a semiconductor nanocrystal layer on a surface of the first inorganic layer, forming a second amorphous inorganic layer on a surface of the semiconductor nanocrystal layer opposite the first inorganic layer by a solution coating method or a vapor coating method, and forming a second electrode on and in electrical contact with a surface of the second inorganic layer.

As such, the first inorganic layer may be formed by a crystalline inorganic material formation process, that is, by subjecting inorganic material on the substrate or first electrode to a crystal growth process such as metal organic chemical vapor deposition ("MOCVD") or atomic layer deposition ("ALD"), or by depositing an amorphous inorganic thin film and then annealing it.

In addition, the first inorganic layer may be formed by an amorphous inorganic material formation process, that is, by applying a dispersion of inorganic material in an organic solvent on the first electrode by a solution coating method selected from the group consisting of a sol-gel process, spin coating, printing, casting, and spraying, or by vapor coating selected from the group consisting of chemical vapor deposition ("CVD"), sputtering, e-beam evaporation, and vacuum deposition.

In the case where the first inorganic layer is formed by deposition and annealing procedures, the annealing treatment can be conducted at 150° C. or less, where a glass substrate or a plastic substrate is used.

Figure 3:
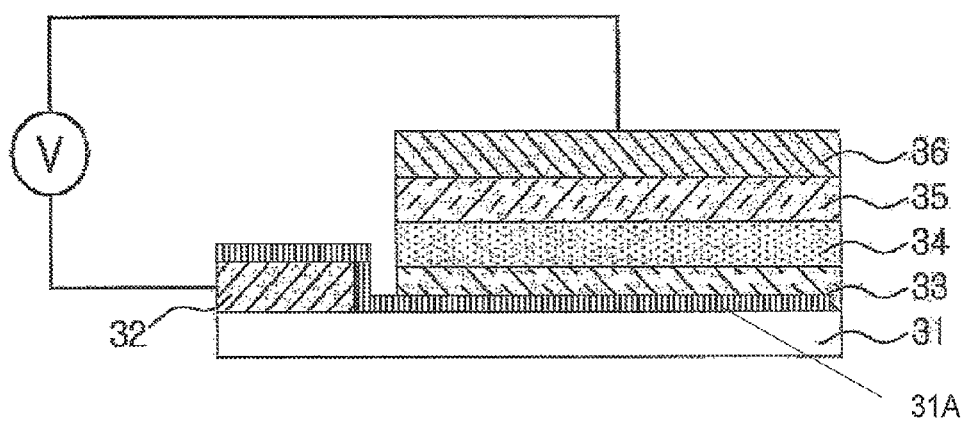
FIG. 3 is a schematic view showing the inorganic electroluminescent diode fabricated in Example 1.

Further, where the first inorganic layer is formed by crystal growth, since the first inorganic layer should be grown on the substrate, the first electrode is formed on a portion of one surface of the substrate as shown in FIG. 3, instead of being formed on the entire surface of the substrate.

In the inorganic electroluminescent diode, since the first inorganic layer is formed and the semiconductor nanocrystal layer is then formed thereon, the first inorganic layer may be prepared using a crystalline formation process at high temperatures, or may be prepared using solution coating or vapor coating performed at low temperatures.

The first inorganic layer thus formed may be used as a hole transport layer for transporting holes to the semiconductor nanocrystal layer or as an electron transport layer for transporting electrons to the semiconductor nanocrystal layer.

In addition, the semiconductor nanocrystal layer may be formed such that semiconductor nanocrystals are arranged on the first inorganic layer in the form of a monolayer, or the semiconductor nanocrystal monolayers may be repeatedly stacked to form a multi-layered structure.

The process of arranging the semiconductor nanocrystals in the monolayer can include known semiconductor nanocrystal arrangement methods, such as spin coating, dipping, spray coating, blade coating, and the like, or the method disclosed in Korean Patent Application No. 2005-0060215, incorporated herein by reference, comprising substituting and modifying the surface of nanocrystals in an organic solvent, removing the organic solvent by vacuum drying, dispersing the nanocrystals in an aqueous solution, and removing cohering particles and impurities by centrifugation to obtain an aqueous solution of the nanocrystals, which is then subjected to a wet process such as spin coating or dip coating to form a thin film.

After the semiconductor nanocrystals are arranged in the monolayer, voids between the semiconductor nanocrystals may be filled with an insulating material, to prevent current leakage due to the voids therebetween.

Further, a protective layer may be formed on the semiconductor nanocrystal layer after forming the semiconductor nanocrystal layer, and before forming the second inorganic layer. The protective layer functions to prevent dissolution of the semiconductor nanocrystals of the semiconductor nanocrystal layer in the solvent used for the formation of the second inorganic layer, and to prevent disruption of the arrangement of the semiconductor nanocrystals. The material for the protective layer is not specifically limited. In an exemplary embodiment, the protective layer is formed of $SiO_2$ by sputtering, e-beam evaporation, or vacuum deposition.

Further, the thickness of the protective layer is not limited so long as current may flow through the protective layer. In an embodiment, the protective layer has a thickness of 2 nm or less to allow tunneling of a carrier.

Subsequently, the second inorganic layer may be formed by a solution coating method or a vapor coating method conducted at low temperatures in order to maintain the properties of the semiconductor of the semiconductor nanocrystal layer. In an exemplary embodiment, a solution coating method includes a sol-gel process, spin coating, printing, casting, and spraying, and a vapor coating method includes CVD, sputtering, e-beam evaporation, and vacuum deposition. The second inorganic layer thus prepared is formed into an amorphous inorganic thin film in amorphous or polycrystalline form. The second inorganic layer may be used as an electron transport layer for transporting electrons to the semiconductor nanocrystal layer or as a hole transport layer for transporting holes to the semiconductor nanocrystal layer.

An inorganic electroluminescent diode is also provided herein, comprising a semiconductor nanocrystal layer, an electron transport layer or a hole transport layer formed on the semiconductor nanocrystal layer using amorphous inorganic material, and a hole transport layer or an electron transport layer formed beneath the semiconductor nanocrystal layer using amorphous or crystalline inorganic material.

According to a first embodiment, an inorganic electroluminescent diode includes am upper electrode and a lower electrode having a semiconductor nanocrystal layer disposed therebetween, an inorganic electron transport layer formed of amorphous inorganic material disposed between the semiconductor nanocrystal layer and the upper electrode, and a hole transport layer formed of inorganic material disposed between the semiconductor nanocrystal layer and the lower electrode, the inorganic material of the hole transport layer being amorphous or crystalline inorganic material.

According to a second embodiment, an inorganic electroluminescent diode includes an upper electrode and a lower electrode having a semiconductor nanocrystal layer disposed therebetween, an inorganic hole transport layer formed of amorphous inorganic material disposed between the semiconductor nanocrystal layer and the upper electrode, and an electrode transport layer formed of inorganic material disposed between the semiconductor nanocrystal layer and the lower electrode, the inorganic material of the electron transport layer being amorphous or crystalline inorganic material.

FIG. 1 is a schematic view showing the inorganic electroluminescent diode according to the first embodiment of the present invention.

As shown in FIG. 1, the inorganic electroluminescent diode has a structure including a first electrode 12 as an anode, an inorganic hole transport layer 13, a semiconductor nanocrystal layer 14, an inorganic electron transport layer 15, and a second electrode 16 as a cathode, which are formed on a substrate 11. When voltage is applied to the first electrode 12 and the second electrode 16, holes are injected into the inorganic hole transport layer 13 from the first electrode 12, while electrons are injected into the inorganic electron transport layer 15 from the second electrode 16. As such, when the holes and electrons thus injected are brought into contact with each other in the semiconductor nanocrystals of the semiconductor nanocrystal layer, they bind to form excitons which subsequently recombine, thereby emitting light.

Figure 2:
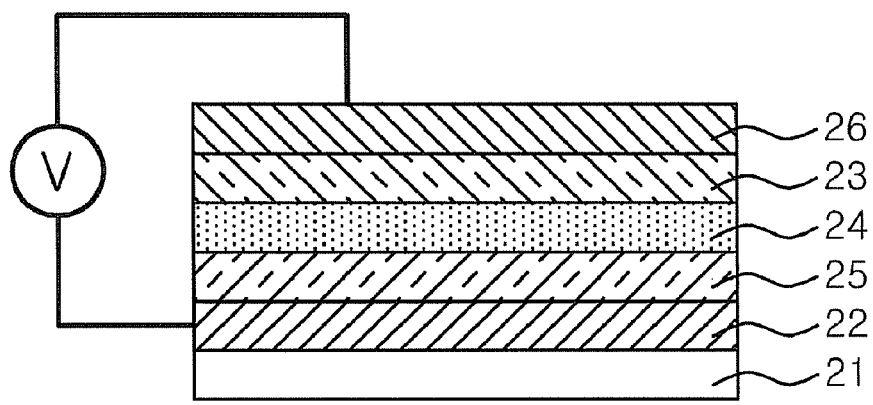
FIG. 2 is a schematic view showing an inorganic electroluminescent diode according to a second embodiment.

Turning now to FIG. 2, a schematic view of the inorganic electroluminescent diode according to the second embodiment of the present invention is shown.

As shown in FIG. 2, the inorganic electroluminescent diode of the present invention has a structure including a first electrode 22 as an anode, an inorganic electron transport layer 25, a semiconductor nanocrystal layer 24, an inorganic hole transport layer 23, and a second electrode 26 as a cathode, which are formed on a substrate 21. When voltage is applied to the first electrode 22 and the second electrode 26, electrons are injected into the inorganic electron transport layer 25 from the first electrode 22, while holes are injected into the inorganic hole transport layer 23 from the second electrode 26. As such, when the holes and electrons thus injected are brought into contact with each other in the semiconductor nanocrystals of the semiconductor nanocrystal layer, they bind to form excitons which subsequently recombine thereby emitting light.

The substrate used in the inorganic electroluminescent diode is not particularly limited so long as it provides transparency, surface flatness, easy handling, and water resistance. In an exemplary embodiment, a glass substrate, a transparent plastic substrate, or a sapphire substrate may be used. In particular, in the case where the electron transport layer or hole transport layer is formed of crystalline semiconductor, a sapphire substrate is specifically useful.

The inorganic material used in the inorganic electron transport layer is composed of inorganic material capable of transporting electrons even in an amorphous state, and more specifically is an oxide selected from the group consisting of $TiO_2$, $ZnO$, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, and $ZrSiO_4$; a nitride selected from the group consisting of $InN$, $AlN$, $GaN$, $Si_3N_4$, or a combination comprising at least one of the foregoing nitrides; or a semiconductor selected from the group consisting of CdS, ZnSe, and ZnS.

The inorganic material used in the inorganic hole transport layer is composed of inorganic material capable of transporting holes even in an amorphous state, and specifically is selected from the group consisting of semiconductors, including CdTe, ZnTe, CdS, ZnSe, and ZnS; metal oxides, including $TiO_2$, $ZnO$, $SiO_2$, $SnO_2$, $WO_3$, $Si_3N_4$, $ZrO_2$, $HfO_2$, $Ta_2O_5$, $BaTiO_3$, $BaZrO_3$, $Al_2O_3$, $Y_2O_3$, and $ZrSiO_4$; and p-doped semiconductors.

The semiconductor nanocrystals used in the semiconductor nanocrystal layer may be formed of any material having a quantum confinement effect due to the size thereof. As disclosed herein, semiconductor materials include a combination of elements from two or more groups from the periodic chart. For example, a Group II-VI compound means a compound that includes an element of Group II and an element of Group VI. In an embodiment, the semiconductor nanocrystal layer is formed of material selected from the group consisting of Group II-VI compound semiconductor nanocrystals, including CdS, CdSe, CdTe, ZnS, ZnSe, ZnTe, HgS, HgSe, and HgTe; Group III-V compound semiconductor nanocrystals, including GaN, GaP, GaAs, InP, and InAs; Group IV-VI nanocrystals, including PbS, PbSe, and PbTe; Group IV nanocrystals, including Si and Ge; and core/shell structures, including CdSe/ZnS, CdSe/ZnSe, CdTe/ZnS, CdTe/ZnSe, CdSe/CdS, CdS/ZnS, CdS/ZeSe, InP/ZnS, and PbSe/ZnS, in which the shell is formed of semiconductor material having a wider band gap.

The semiconductor nanocrystal layer can be in the form of a monolayer of semiconductor nanocrystals. Further, the semiconductor nanocrystal layer may be in the form of a multi-layered structure having two or more monolayers. In the semiconductor nanocrystal layer, the semiconductor nanocrystal monolayer may be formed of semiconductor nanocrystals having a consistent color. In addition, the semiconductor nanocrystal monolayer may be formed of semiconductor nanocrystals having varying colors and thus may show a mixed color, such as white. In addition, semiconductor nanocrystal monolayers, each showing a different, consistent color, can be aligned in a multi-layered structure, wherein the net effect is to provide a mixed color such as white.

In the inorganic electroluminescent diode of the present invention, a protective layer may be further formed on the semiconductor nanocrystals layer, 14, 24 and 34. The protective layer functions to prevent the dissolution of the semiconductor nanocrystals of the semiconductor nanocrystals layer in the solvent used for the formation of the electron transport layer or hole transport layer and to prevent disruption of the arrangement of the semiconductor nano crystals. The protective layer may be formed of any material without limitation. In an embodiment, the protective layer is made of $SiO_2$.

The thickness of the protective layer is not limited as long as current can flow. In an embodiment, the protective layer has a thickness of 2 nm or less to realize easy tunneling of the carrier.

The first electrode is formed of material selected from the group consisting of ITO (Indium Tin Oxide), IZO (Indium Zinc Oxide), nickel (Ni), platinum (Pt), gold (Au), silver (Ag), iridium (Ir), palladium (Pd), and oxides thereof.

The second electrode is formed of material selected from the group consisting of I, Ca, Ba, Ca/Al, LiF/Ca, $BaF_2$/Al, $BaF_2$/Ca/Al, Al, Mg, and Ag/Mg alloys.

A better understanding of the present invention may be obtained by the following examples, which are meant to be illustrative, but should not be considered as limiting thereto.

EXAMPLE 1

Fabrication of Electroluminescent Diode of Crystalline HTL and Amorphous ETL Structure In FIG. 3, on one surface of a sapphire substrate 31, palladium was deposited to a thickness of 50 nm by thermal evaporation, followed by deposition of gold (Au) to a thickness of 200 nm was deposited, thus forming a palladium/gold alloyed electrode 32. Thereafter, a p-doped crystalline GaN thin film having a thickness of 2.5 μm was grown on the sapphire substrate 31 by MOCVD. Further, a hole transport layer ("HTL") 33 was grown to a thickness of 200 nm at a substrate temperature of 1050° C.

On the GaN thin film, a solution of 0.3 wt % of red CdSe/ZnS core/shell nanocrystals (Evidot® 630 nm absorbance)

(Evident Technology, trade name: Evidot® Red (CdSe/ZnS)) in chloroform was dispensed and spin coated at 2000 rpm for 30 sec, and then dried at 50° C. for 5 min, thus forming a semiconductor nanocrystal layer 34 of 25 nm thickness.

Subsequently, $TiO_2$ was applied to a thickness of 60 nm on the completely dried semiconductor nanocrystal layer 34 by e-beam evaporation, thus forming an electron transport layer ("ETL") 35.

Then, a layer of LiF of 5 nm thickness, and a layer of aluminum of 200 nm thickness were sequentially deposited on the electron transport layer (ETL) 35 using a patterned mask, thus forming an electrode 36, after which the device was sealed using a glass substrate (not shown) so as to prevent the penetration of oxygen and moisture, therefore fabricating an inorganic electroluminescent diode. The schematic view of the electroluminescent diode thus fabricated is shown in FIG. 3.

EXAMPLE 2

Fabrication of Electroluminescent Diode of Crystalline HTL and Liquid Amorphous ETL Structure On a sapphire substrate, a p-doped crystalline GaN thin film was grown to a thickness of 200 nm at a substrate temperature of 1050° C. by MOCVD, thus forming a hole transport layer. On the p-doped crystalline GaN thin film, a solution of 0.3 wt % of red CdSe/ZnS core/shell nanocrystals in chloroform was dispensed and spin coated at 2000 rpm for 30 sec, and then dried at 50° C. for 5 min, thus forming a semiconductor nanocrystal layer of 25 nm thickness.

Thereafter, an $SiO_2$ thin film about 1 nm thick was formed on the completely dried semiconductor nanocrystal layer by e-beam evaporation, thus forming a protective layer. Then, $TiO_2$ precursor sol (DuPont Tyzor® BTP, 2.5 wt % in butanol) was spin coated at 2000 rpm for 30 sec on the protective layer, dried for about 5 min at 50° C., and annealed at 100° C. for 30 min, thus forming an electron transport layer in the form of an amorphous $TiO_2$ thin film of about 40 nm thickness.

On the $TiO_2$ thin film, a layer of LiF of 5 nm thickness and aluminum of 200 nm thickness were sequentially deposited using a patterned mask, thus forming an electrode, after which the device was sealed using a glass substrate so as to prevent the penetration of oxygen and moisture, therefore fabricating an inorganic electroluminescent diode.

EXAMPLE 3

Fabrication of Quantum Dot Electroluminescent Diode of Amorphous (CdTe, HTL) and Amorphous ($TiO_2$, ETL) Structure A glass substrate having ITO features patterned thereon was sequentially washed with neutral detergent, deionized water, water, and isopropyl alcohol, and then was subjected to UV-ozone treatment, and a CdTe thin film of 40 nm thickness was subsequently vacuum deposited on the ITO substrate. The temperature of the substrate was maintained at about 200° C., and an amorphous CdTe thin film about 40 nm thickness was formed. Subsequently, a semiconductor nanocrystal layer, an ETL, and an electrode were sequentially deposited on the CdTe thin film in the same manner and having the same thicknesses as provided in Example 1, thus fabricating an inorganic electroluminescent diode.

Figure 4:
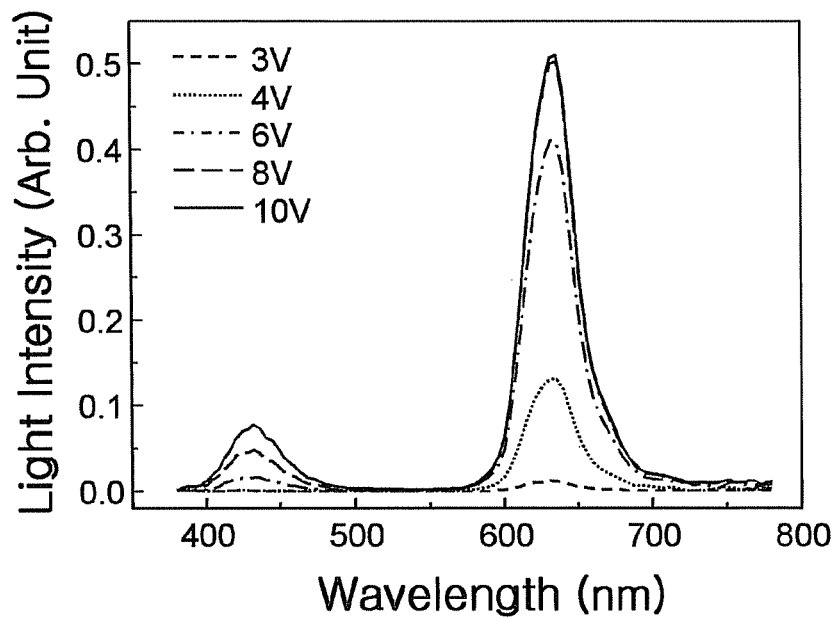
FIG. 4 is a graph showing the light intensity of the inorganic electroluminescent diode fabricated in Example 1.

FIG. 4 shows the light intensity of the inorganic electroluminescent diode fabricated in Example 1. As shown in FIG. 4, the above electroluminescent diode was confirmed to emit light at 623 nm, and the light intensity was found to increase depending on the magnitude of voltage (V) applied to the electrodes.

Figure 5:
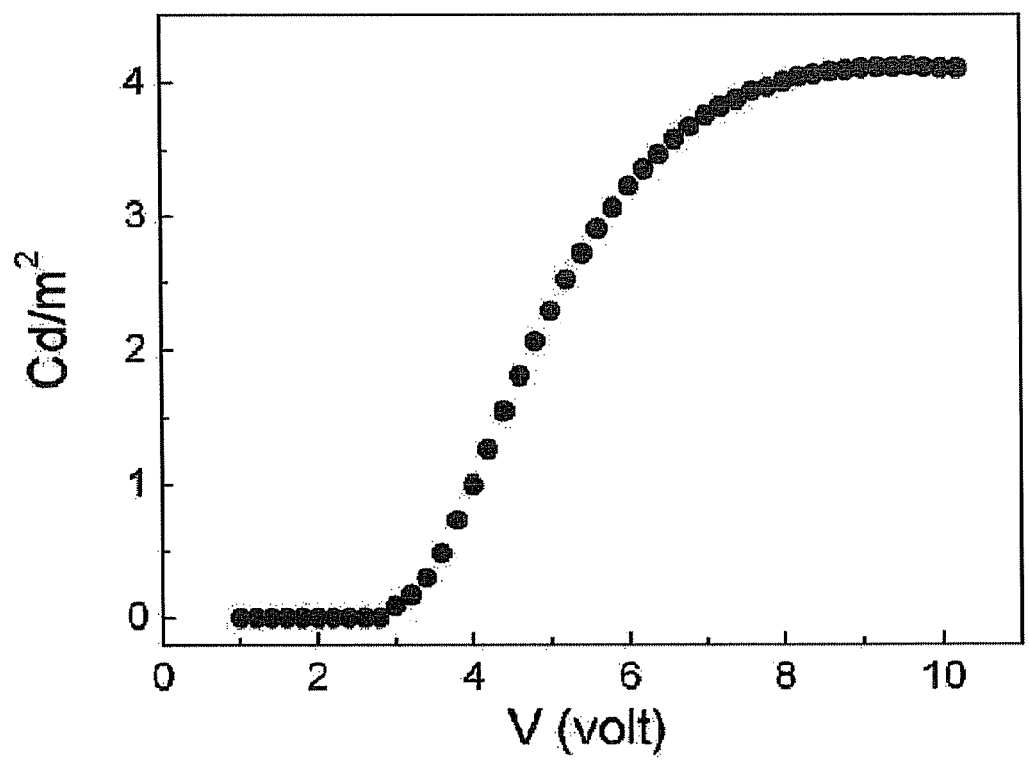
FIG. 5 is a graph showing the brightness of light per unit area depending on an increase in voltage of the inorganic electroluminescent diode fabricated in Example 1.

FIG. 5 shows the increase in brightness of light per unit area with increasing voltage for the inorganic electroluminescent diode fabricated in Example 1. As shown in FIG. 5, the inorganic electroluminescent diode was confirmed to initiate emission of light at 2.8 V and to emit light at an intensity of 4 $Cd/m^2$ at 8 V or higher.

The method of fabricating the inorganic electroluminescent diode of the present invention enables the fabrication of the inorganic electroluminescent diode while maintaining the properties of luminescent semiconductor material of the semiconductor crystal layer, and also provides an inorganic electroluminescent diode which shows stable operation and has high luminescent efficiency.

As described hereinbefore, the present invention provides an inorganic electroluminescent diode and a method of fabricating the same. According to the method of fabricating the inorganic electroluminescent diode, when the inorganic layer is formed on a semiconductor nanocrystal layer, a low-temperature solution coating or vapor coating is used, and thus, the semiconductor nanocrystals or the structure of the semiconductor nanocrystal layer is not significantly adversely affected, consequently maintaining luminescent efficiency of the diode while increasing the lifetime thereof.

In addition, the inorganic electroluminescent diode of the present invention, including a semiconductor nanocrystal layer, an electron transport layer, and a hole transport layer, which are each formed of inorganic material, is resistant to moisture and air and can be stably operated even under high voltage conditions, leading to increased efficiency and lifetime of the diode. Moreover, since the inorganic electroluminescent diode is formed of inorganic thin films, it can decrease interfacial resistance occurring at the interface of organic material and inorganic material of conventional organic/inorganic devices, thus providing increased stability for the inorganic electroluminescent diode.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An inorganic electroluminescent diode, comprising
a lower electrode and an upper electrode including a semiconductor nanocrystal layer therebetween,
an inorganic electron transport layer including amorphous inorganic material and between the semiconductor nanocrystal layer and the upper electrode,
a protective layer between the semiconductor nanocrystal layer and the inorganic electron transport layer; and
a hole transport layer including inorganic material and between the semiconductor nanocrystal layer and the lower electrode,
wherein
the semiconductor nanocrystal layer is a multi-layered structure having two or more mono layers; and
the protective layer has a thickness of 2 nm or less.

2. The diode as set forth in claim 1, wherein the inorganic material of the hole transport layer is amorphous inorganic material.

3. The diode as set forth in claim 1, wherein the inorganic material of the hole transport layer is crystalline inorganic material.

4. An inorganic electroluminescent diode, comprising
an upper electrode and a lower electrode including a semiconductor nanocrystal layer therebetween,
an inorganic hole transport layer including amorphous inorganic material between the semiconductor nanocrystal layer and the upper electrode,
a protective layer between the semiconductor nanocrystal layer and the inorganic hole transport layer, and having a thickness of 2 nm or less; and
an electron transport layer including inorganic material between the semiconductor nanocrystal layer and the lower electrode,
wherein the semiconductor nanocrystal layer is a multi-layered structure including two or more mono layers.

5. The diode as set forth in claim 4, wherein the inorganic material of the electron transport layer is amorphous inorganic material.

6. The diode as set forth in claim 4, wherein the inorganic material of the electron transport layer is crystalline inorganic material.

7. The diode as set forth in claim 1, wherein the inorganic material of the electron transport layer is selected from the group consisting of: oxides, including $TiO_2$, $ZnO$, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, and $ZrSiO_4$; nitrides, including $InN$, $AlN$, $GaN$, $Si_3N_4$, and mixtures thereof; and semiconductors, including $CdS$, $ZnSe$, and $ZnS$.

8. The diode as set forth in claim 1, wherein the semiconductor nanocrystal layer is formed of material selected from the group consisting of Group II-VI compound semiconductor nanocrystals, including CdS, CdSe, CdTe, ZnS, ZnSe, ZnTe, HgS, HgSe, and HgTe; Group III-V compound semiconductor nanocrystals, including GaN, GaP, GaAs, InP, and InAs; Group IV-VI nanocrystals, including PbS, PbSe, and PbTe; Group IV nanocrystals, including Si and Ge; and core/shell structures, including CdSe/ZnS, CdSe/ZnSe, CdTe/ZnS, CdTe/ZnSe, CdSe/CdS, CdS/ZnS, CdS/ZeSe, InP/ZnS, and PbSe/ZnS, in which the shell is formed of semiconductor material having a wider band gap.

9. The diode as set forth in claim 1, wherein the inorganic material of the hole transport layer is selected from the group consisting of semiconductors, including CdTe, ZnTe, CdS, ZnSe, and ZnS; metal oxides, including $TiO_2$, $ZnO$, $SiO_2$, $SnO_2$, $WO_3$, $Si_3N_4$, $ZrO_2$, $HfO_2$, $Ta_2O_5$, $BaTiO_3$, $BaZrO_3$, $Al_2O_3$, $Y_2O_3$, and $ZrSiO_4$; and p-doped semiconductors.

10. An inorganic electroluminescent diode, comprising:
a first electrode on a substrate;
an inorganic hole transport layer including inorganic material, in electrical contact with the first electrode;
a semiconductor nanocrystal layer on a surface of the inorganic hole transport layer, the semiconductor nanocrystal layer being a multi-layered structure having two or more monolayers;
a protective layer on a surface of the semiconductor nanocrystal layer, the protective layer having a thickness of 2 nm or less;
an inorganic electron transport layer including amorphous inorganic material on a surface of the protective layer opposite the inorganic hole transport layer; and
a second electrode on and in electrical contact with a surface of the inorganic electron transport layer opposite the semiconductor nanocrystal layer;
wherein the layers are sequentially on the substrate.

11. An inorganic electroluminescent diode, comprising:
a first electrode on a substrate;
an inorganic electron transport layer including inorganic material, in electrical contact with the first electrode;
a semiconductor nanocrystal layer on a surface of the inorganic electron transport layer opposite the first electrode, the semiconductor nanocrystal layer being a multi-layered structure having two or more monolayers;
a protective layer on a surface of the semiconductor nanocrystal layer, the protective layer having a thickness of 2 nm or less;
an inorganic hole transport layer including amorphous inorganic material on a surface of the protective layer opposite the inorganic electron transport layer; and
a second electrode on and in electrical contact with a surface of the inorganic hole transport layer opposite the semiconductor nanocrystal layer;
wherein the layers are sequentially on the substrate.

* * * * *